(12) United States Patent  
Bruel

(10) Patent No.: US 6,730,208 B1
(45) Date of Patent: May 4, 2004

(54) CHIP AND METHOD FOR FITTING OUT A CHIP COMPRISING A PLURALITY OF ELECTRODES

(75) Inventor: Michel Bruel, Veurey (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/979,662

(22) PCT Filed: May 31, 2000

(86) PCT No.: PCT/FR00/01506

§ 371 (c)(1),
(2), (4) Date: Nov. 26, 2001

(87) PCT Pub. No.: WO00/75995

PCT Pub. Date: Dec. 14, 2000

(30) Foreign Application Priority Data

Jun. 2, 1999 (FR) .............................. 99 06949

(51) Int. Cl.⁷ ............................ C25D 5/00; H01L 31/04
(52) U.S. Cl. .................... 205/91; 208/80; 208/118; 208/136; 136/200; 136/205; 136/244; 136/256; 136/291; 257/414; 257/431; 257/435; 257/448; 257/459; 310/311; 310/314; 310/365
(58) Field of Search ................... 310/311, 312, 310/314, 318, 319, 365; 136/200, 205, 244, 246, 253, 256, 291, 293; 257/184, 414, 431, 435, 448, 459; 435/283.1, 287.9, 287.1, 68.1, 89, 90, 91.1, DIG. 46, DIG. 47, DIG. 49; 205/80, 86, 91, 92, 147, 118, 136, 413, 414; 536/25.3, 25.31

(56) References Cited

U.S. PATENT DOCUMENTS

| 4,160,678 A | * | 7/1979 | Jain et al. .................... 136/255 |
| 5,330,918 A | | 7/1994 | Dubbelday et al. |
| 5,512,162 A | * | 4/1996 | Sachs et al. ................... 205/91 |
| 5,866,471 A | * | 2/1999 | Beppu et al. ................. 438/502 |
| 5,985,568 A | * | 11/1999 | Krihak et al. ................... 435/6 |
| 6,027,956 A | * | 2/2000 | Irissou ........................ 438/68 |
| 6,203,985 B1 | * | 3/2001 | Jiang et al. .................... 435/6 |
| 6,309,782 B1 | * | 10/2001 | Ohtsu et al. ................... 430/7 |
| 6,436,591 B1 | * | 8/2002 | Ohtsu et al. ................... 430/7 |

FOREIGN PATENT DOCUMENTS

| DE | 19715138 | 10/1998 |
| EP | 0890651 | 1/1999 |
| FR | 2741476 | 5/1997 |
| FR | 2754276 | 4/1998 |
| FR | 2757949 | 7/1998 |
| WO | WO 98/14637 | 4/1998 |

OTHER PUBLICATIONS

Abdukadyrov, et al., "Properties of High–Voltage GaAs–AlGaAs Photoconverters Illuminated Through a Wide–Band Substrate", vol. 29, No. 5, 5 pages.

"Photovoltaic Hydrogen Sensor", Jul. 1989, 2 pages.

Manoli, et al., "A monolithic sensor array of individually addressable microelectrodes", May 1, 1994, vol. A43, 6 pages.

Fiaccabrino, et al., "On Chip Detection of Electrogenerated Chemiluminescence of Ru(bpy) at Pt Interdigitated Microelectrode Arrays", Jun. 16, 1997, 4 pages.

* cited by examiner

Primary Examiner—Nam Nguyen
Assistant Examiner—Brian L. Mutschler
(74) Attorney, Agent, or Firm—Thelen Reid & Priest LLP

(57) ABSTRACT

Chips, and methods of manufacturing thereof, comprising a base having a surface, and a plurality of components integrated in the base. Each component is coupled to at least one individual electrode disposed on the surface and to a counter-electrode. Each component operates as an electric generator, when activated by a power supply external to the chip. The counter-electrode is disposed such that each activated component creates a polarization voltage and/or a polarization current between that at least one individual electrode and the counter-electrode, when a medium is brought into contact with the surface.

19 Claims, 4 Drawing Sheets

CHIP AND METHOD FOR FITTING OUT A CHIP COMPRISING A PLURALITY OF ELECTRODES

This application is a national phase of PCT/FR00/01506 which was filed on May 31, 2000, and was not published in English.

FIELD OF THE INVENTION

The present invention relates to a chip comprising a plurality of electrodes and a method for populating such a chip.

Within the scope of the invention, and by analogy with the meaning of the word in the field of micro-electronics, "chip" refers to a small solid part with at least one main surface and one, or more functional parts or components. The typical measurements of a chip can be for example 1 cm×1 cm×0.1 cm.

In the present invention, the components of the chip are studs or electrodes that are functionalized and disposed, for example, in a regular orthogonal network.

The invention has applications in the field of biological or chemical sensors. The electrodes are then functionalized individually, being coated with a reagent capable of reacting with a given chemical molecule or capable of fixing a given biological material such as a strand of DNA.

The various electrodes of a single chip can be coated with various reagents capable of reacting with various molecules or various types of DNA strands. The molecules or biological material are then referred to as chemical or biological "targets".

Chips, the electrodes of which are coated with various biological sensors, i.e. with reagents sensitive to certain biological targets, are referred to as DNA chips.

The invention also has applications in producing identification or calibration parts for which the electrodes are selectively coated with stable metal isotopes such as iron, nickel or cobalt.

BACKGROUND ART

Among the various techniques generally implemented to coat the electrodes of chips or DNA chips, techniques are particularly used that use electronic addressing of the electrodes. Electronic addressing is used to cause a coating deposit to form selectively on the addressed electrodes.

To this end the chip is successively brought into contact with one or more mediums, particularly electrolytes, and the formation of the coating deposit is initiated by applying a polarization voltage to the selected electrodes.

Alternatively, the coating deposit can also be formed as a result of an electrolytic current that is passed through the medium from the selected electrodes to one or more counter-electrodes.

In order to simplify the description the voltages applied to the electrodes or the electrolytic currents initiated from the electrodes are referred to below as "polarization" voltage and current.

An illustration of the techniques mentioned above is given in French patent FR-A-2 754 276 or in French patent FR-A-2 741 476 that concerns a method for collectively producing chips selectively coated with a deposit.

The electrodes are generally electrically addressed via a plurality of addressing terminals provided, for example, on one edge of the chip and electrically connected to the electrodes by connection lines embedded in the base of the chip.

When there are a small number of electrodes on the surface of the chip each addressing terminal can be individually connected to an electrode.

However, when there are a large number of electrodes a complex connection network and a system for multiplexing the electrical addressing commands is required for the selective and individual polarization of each electrode.

The complexity of the addressing system considerably increases the cost of the chips and multiplies the rate of faulty chips due to defective internal connections. It is therefore necessary to perform a test ensuring correct operation at various stages in the chip production process to eliminate defective chips at every stage.

This has an impact on the yield of the chip production process and the cost.

DISCLOSURE OF THE INVENTION

The aim of the present invention is to propose an improved chip enabling electrodes to be coated selectively while avoiding the drawbacks mentioned above.

A particular aim is to apply polarization voltages or currents to the electrodes without resorting to a complex electronic addressing network and multiplexing systems.

A further aim is to propose a chip that can comprise a very large number of electrodes and yet be reliable and economic to produce.

A final aim is to propose a method for coating such a chip that is simple to implement.

More precisely, to achieve these aims the invention relates to a chip comprising:

a base, electrodes provided on a surface of the base and a plurality of electric generators integrated in the base and connected to a plurality of said electrodes such that each electrode is only connected to a single generator.

The electrodes can be advantageously separated from each other such that they constitute either microgrooves or projecting structures known as "mesas".

"Electric generators" refer to components capable of providing a voltage or electric current in response to external, particularly thermal, luminous or mechanical stimulus applied to the chip.

In particular, the generators used to produce the chip of the invention can be thermoelectric, photo-voltaic or piezoelectric generators.

Each generator is preferably located in the base near one or more electrodes to which it is connected.

In one particular embodiment of the chip the base of the chip may comprise a transparent substrate to activate the electric generators by means of at least one beam of light.

The base material of the substrate is selected to be transparent particularly to the wavelength or range of wavelengths of an insolation beam used to selectively light or heat one or more electric generators.

When they are photo-voltaic-type generators each one can comprise at least one junction of semi-conductors with a first region of a first type of conductivity connected to at least one electrode and a second region of a second type of conductivity connected to a counter-electrode.

The two regions together constitute the junction. They can be created by doping a layer of single- or poly-crystal silicon.

These generators, which are photo-voltaic cells, can also be produced using other materials such as hydrogenated amorphous silicon, gallium arsenide, germanium, silicon carbide or indium phosphide for example. The choice of semi-conductor material determines the height of the forbidden band and thus enables the nominal voltage of the generator to be set. It also sets the optical absorption properties and therefore the excitation wavelength range of the generators. Table I below gives the values of the forbidden band (Gap) of the zero-current voltage (Vco) and the short-circuit current (Isc) authorized by the main materials which are used alone or combined to produce the generators. "Combined use" is understood to mean connecting two photo-voltaic junctions such as GaInP/GaAs in series.

TABLE I

|  | Gap | Vco (mV) | Isc (mA/cm$^2$) |
|---|---|---|---|
| Single-crystal Si | 1.1 | 709 | 40.9 |
| Poly-crystal Si | 1.1 | 636 | 36.5 |
| a-Si:H | 1.6 | 887 | 19.4 |
| CdTe | 1.45 | 843 | 25.1 |
| CIS (CuInSe$_2$) | 1.17 | 641 | 35.8 |
| Solid AsGa | 1.4 | 1022 | 8.2 |
| Multi-junction GaInp/GaAs |  | 2488 | 14.2 |

One or more counter-electrodes can be provided to pass an electrolytic current through a medium containing the deposit material. They can be created on the same base or separated from the base but electrically connected to the electric generators.

The chips of the invention can be independent or associated in a system of a plurality of adjacent chips which are created, for example, on the same wafer of semi-conductor material.

The invention also relates to a method for coating a chip such as that described above comprising one or more generators. According to the method the electrodes are brought into contact with a medium capable of creating a deposit when a voltage and/or polarization current is applied and at least one electrical generator is selectively activated to cause selective polarization of at least one electrode connected to said generator. The generators are activated by means that are external to chip, for example a beam of light or a beam of electrons.

When the generator is a light-sensitive photo-voltaic generator a visible or UV beam of light is preferably selected whereas when the generator is thermoelectric a visible, UV or infrared beam of light may be selected.

According to one particular implementation of the method, the beam of light can be applied by means of a light-source comprising a plurality of individual light-sources arranged such that it matches respectively said plurality of electric generators of the chip. The medium capable of creating a deposit can be a fluid medium, particularly liquid, or possibly a powder.

In this particular implementation the electrodes of the chip are preferably arranged according to an orthogonal network that is more or less regular and that matches a strip or array of electroluminescent diodes or laser diodes used as individual sources. The individual sources can be mounted in a base which may be equipped with a network of microlenses adjusted to the sources and on which a chip or assembly of chips can be deposited for the luminous addressing of the generators.

In one variant the beam of light can also be applied from a source of scattered light using an insolation mask. The mask has apertures that selectively match the electric generators to be activated.

This type of insolation technique is particularly simple to implement as it uses techniques known in the field of photolithography to produce electronic chips.

Other characteristics and advantages of the invention will be better understood from the following description. The description is a non-limitative example and refers to the attached figures.

DETAILED DESCRIPTION OF IMPLEMENTATIONS OF THE INVENTION

Figure 1:
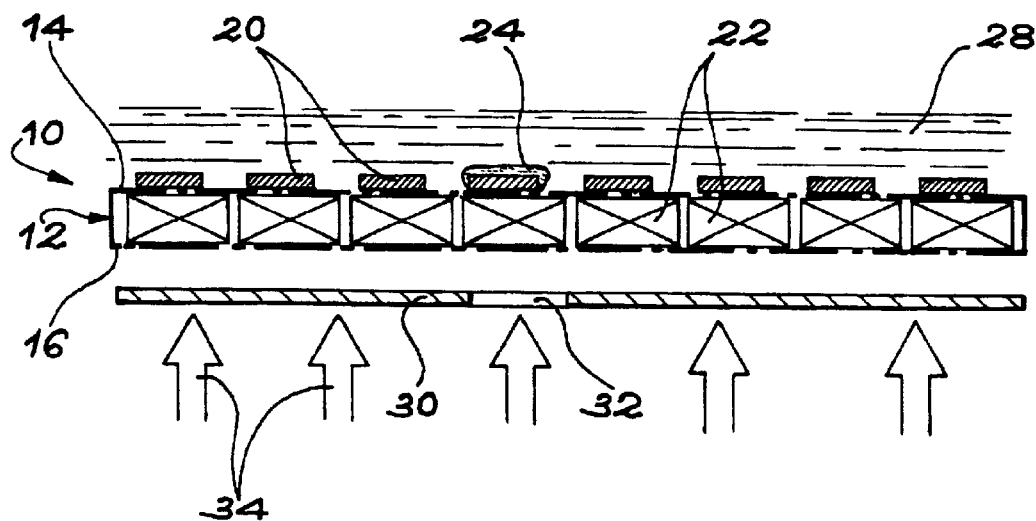
FIG. 1 is a simplified schematic drawing of a chip of the invention and shows the method for coating the electrodes of the invention.

FIG. 1 shows a chip 10 comprising a base 12 a first surface 14, called "main surface" below, of which is provided with a plurality of electrodes 20.

The electrodes are electrically insulated from each other and disposed as an array or a regular orthogonal network.

It may be observed that there is an electric generator 22 under each electrode that is integrated into base 12 and connected to said electrode.

In the examples described with reference to the figures, electric generators 22 are photo-voltaic generators, for example of the solar-cell type, and are capable of providing a current in response to luminous stimulus.

It should be noted that in other implementations the generators can be replaced, for example, with thermoelectric generators.

In FIG. 1 electrodes 20 are in contact with a medium 28, such as a solution of pyrrole monomers capable of creating a coating deposit in response to a electric potential (current).

In the example shown, a coating deposit 24 is only required on one of electrodes 20.

The deposit is created by applying an activation light selectively to the electric generator which is precisely connected to the electrode concerned.

The light, which is provided by a luminous source (not shown), is directed towards rear surface 16 of base 12 using a mask. Mask 30 has an aperture 32 such that it only lets light through in the direction of the selected electric generator while protecting the other generators. The light is shown by arrows 34 in the figure.

The choice of mask, and more precisely the distribution of the apertures over the mask, enables the electrodes, the associated generators of which are activated and on which a deposit is created, to be selected easily.

The direct association of an electrode with each generator facilitates selection and reduces the constraints related to the internal connections to a minimum. The generator can be disposed under or near the matching electrode. The chip is therefore particularly economical and reliable.

However, several electrodes can also be associated with the same generator, said generator being either under or near the electrodes.

Furthermore, localized insolation techniques through a mask have been tried and tested in the field of electronic component production and have proved suited to the present application.

A mask can also be used that has selectively controllable and addressable transmission patterns such as the liquid-crystal masks used, for example, in flat screens.

Figure 2:
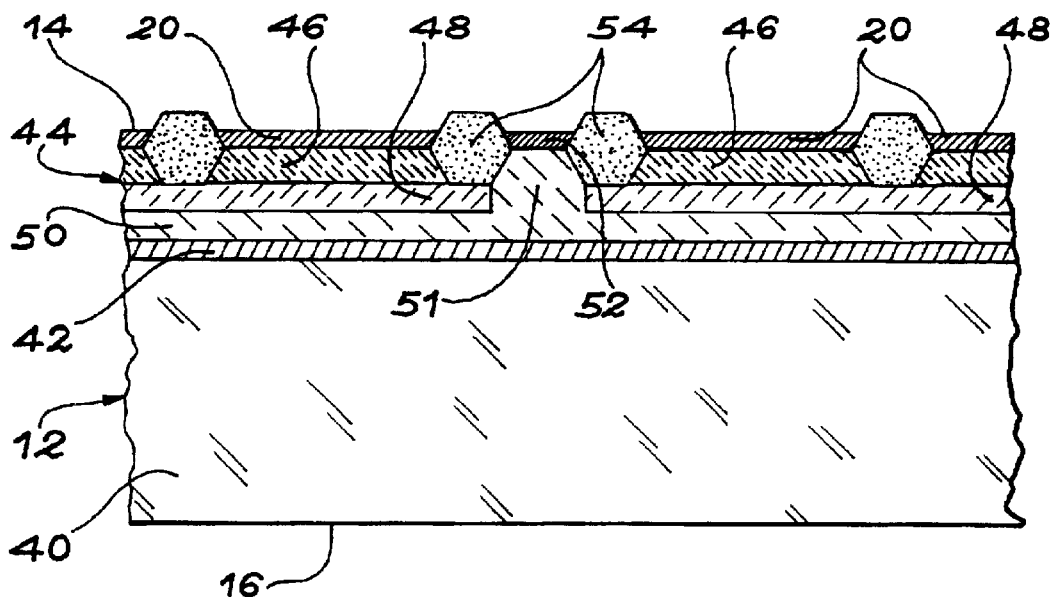
FIG. 2 is an enlarged schematic cross section of part of a chip of the invention comprising photo-voltaic generators and constitutes a first embodiment.

FIG. 2 shows a larger scale view of a structure of a particular embodiment of a chip according to the invention. In this figure, and in the following figures, identical or similar parts to those described above have the same numbers.

Base 12 is seen to comprise a glass substrate 40 that constitutes rear surface 16. The glass substrate ensures the rigidity of the chip and is selected for its transparency to an activation light capable of being applied to the chip from the rear surface.

The surface opposite rear surface 16 of glass substrate 40 is coated with a layer 42 of transparent conductor material followed by a layer 44 of semi-conductor.

The layer of transparent conductor material 42 is, for example, a layer of indium-tin oxide (ITO) while the semi-conductor layer may be silicon.

Other semi-conductor materials, particularly those suggested in table I, can be used to replace the silicon.

A plurality of photo-voltaic cells are formed in layer 44. Each cell is respectively associated with and connected to an electrode 20.

The photo-voltaic cells are respectively created from a first region 46 of a first type of conductivity respectively in contact with associated electrode 20 and from a second region 48 surrounding first region 46 of a second type of conductivity.

The first and second regions, which are respectively N$^+$- and P-type for example, constitute a photo-voltaic junction capable of providing a current when lit. They are created by doping silicon layer 44.

A third doped region 50, which is common to all the photo-voltaic cells, is also of the second type of conductivity but has a greater concentration of doping impurities than that of second region 48 of each cell. In the example described the first, second and third regions are of type N$^+$, P and P$^+$ respectively.

Third region 50 lies above transparent conductor layer 42 and electrically connects the second regions of the photo-voltaic cells to at least one counter-electrode 52. For this purpose the third region constitutes a passage 51 that passes through the second doped region to come into contact with the counter-electrode.

Similarly to electrodes 20, counter-electrode 52 consists of conductor studs made of aluminum for example (possibly coated with gold) that are disposed on first surface 14 of the base.

The electrodes are insulated from each other and from the counter-electrodes by segments 54 of field oxide created on the surface of semi-conductor layer 44. The segments extend at least partly into the layer.

The ITO transparent conductor layer is intended to improve the conduction of third doped region 50 in a plane that lies under the photo-voltaic cell assembly.

In a simplified embodiment the transparent conductor layer is not used such that there is only the third doped region.

Figure 3:
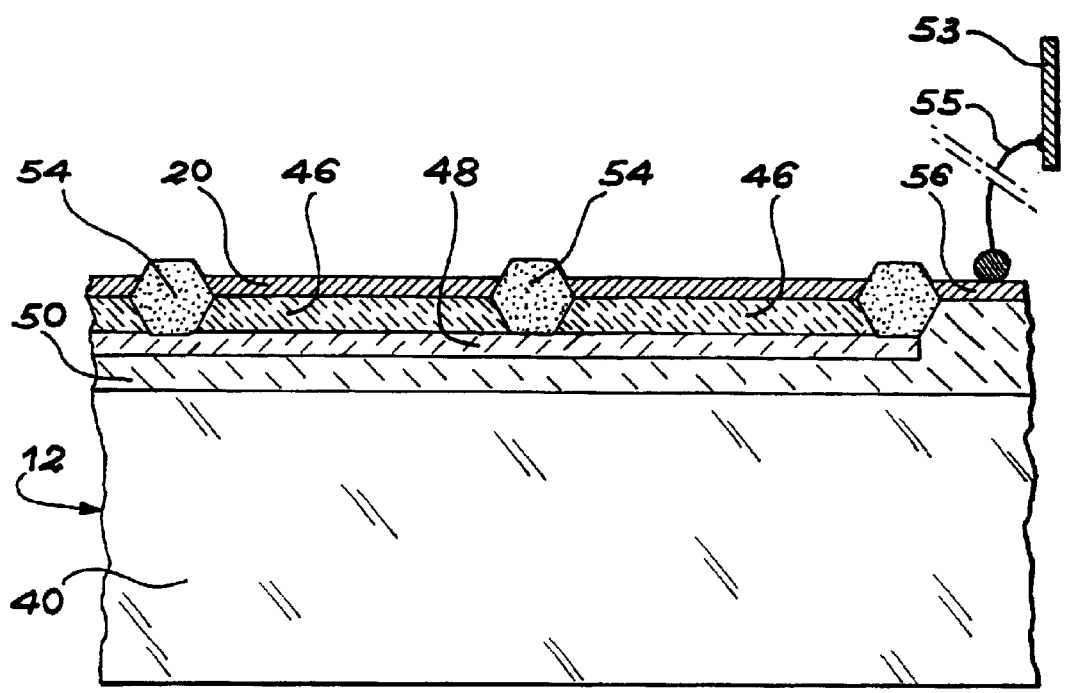
FIG. 3 is an enlarged schematic cross section of part of a chip of the invention comprising photo-voltaic generators and constitutes a second embodiment.

This type of simplified embodiment is shown in FIG. 3. The embodiment of FIG. 3 also differs from that of FIG. 2 by the fact that the chip is associated with a counter-electrode 53, which is separated from the chip, and is connected by a conductor wire 55 to a connection terminal 56 in electrical contact to third doped region 50.

Figure 4:
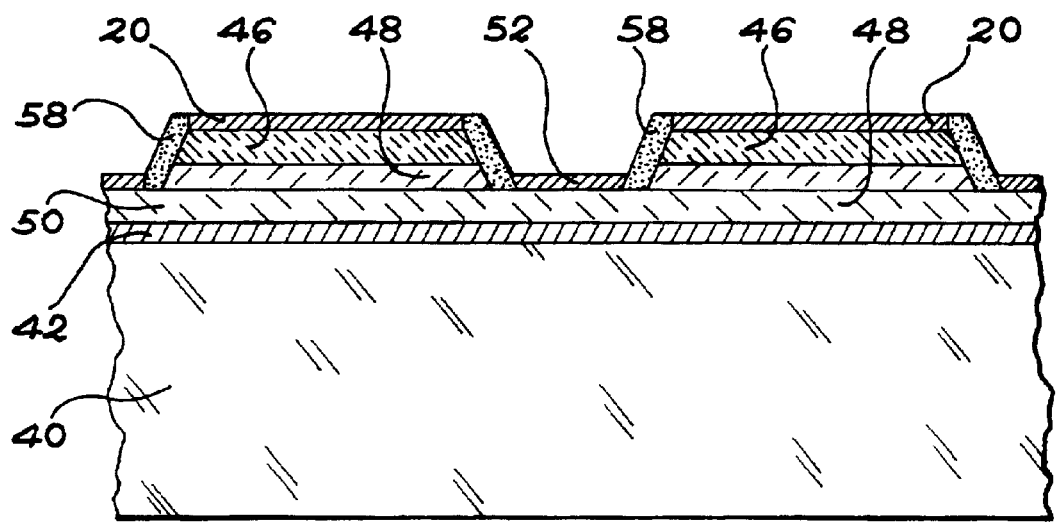
FIG. 4 is an enlarged schematic cross section of part of a chip of the invention comprising photo-voltaic generators and constitutes a third embodiment incorporating a structure known as "mesa".

Whereas FIGS. 1 to 3 relate to chips with planar-type electrodes, i.e. chips the upper surface 14 of which is more or less plane or in the shape of microgrooves, FIG. 4 shows a variant in which electrodes 20 project relative to the surface of the chip. The structure of the chip shown in FIG. 4 is known as a "mesa" structure.

The mesa structure has the same layers and parts as those described in reference to FIGS. 2 and 3 and the above description may therefore be referred to.

It may be observed, however, that part of the semi-conductor layer has been etched between electrodes 20 in order locally to eliminate the second region of the semi-conductor layer and to create counter-electrodes 52 directly on third doped region 50. The third region 50, which lies above the transparent conductor layer, is not provided with passages 51 passing through the second doped region as shown in FIG. 2.

Referring back to FIG. 4, the lateral sides of the of portions of second doped region 48 are coated with an oxide protection 58. One of the main functions of the oxide is to electrically insulate electrodes 20 on the projecting parts and counter-electrodes 52 in the depressions.

Figure 5:
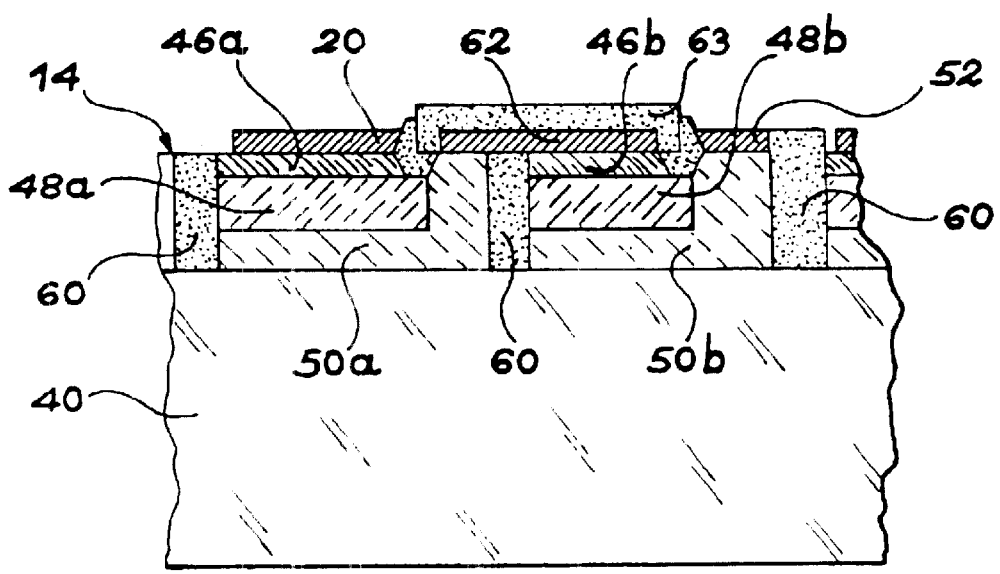
FIG. 5 is an enlarged schematic cross section of part of a chip of the invention and constitutes a fourth embodiment in which the generators comprise two photo-voltaic cells in series.

FIG. 5 shows an embodiment of the chip in which each electric generator of each electrode comprises two photo-voltaic cells in series disposed side by side.

In the figure the first, second and third doped regions of a first cell are numbered 46$a$, 48$a$ and 50$a$. These regions respectively correspond to regions 46, 48 and 50 described above in reference to FIG. 2. A second cell comprises matching regions that are similarly numbered 46$b$, 48$b$, 50$b$.

The two cells are electrically insulated from each other and from the cells of nearby electrodes by insulating barriers 60, for example made of silicon oxide. Barriers 60 run from surface 14 to glass substrate 40 and together with glass substrate 40 create insulated housings that each contain a junction photo-voltaic cell.

It will be noted that only doped first zone 46$a$ of the first cell is in contact with an electrode 20. Second doped region 48$a$ of the first cell is connected to first doped region 46$b$ of the second cell via third doped region 50$a$ of the first cell and via a conductor path 62. The conductor path is covered by a layer of oxide 63 to prevent it from coming into contact with an electrolyte or another medium applied to the electrodes.

Second doped region 48$b$ of the second cell is connected to a counter-electrode 52 via third doped region 50$b$ of the second cell. The generator structure therefore comprises two diodes or photo-voltaic junctions in series between an electrode and a counter-electrode.

Figure 6:
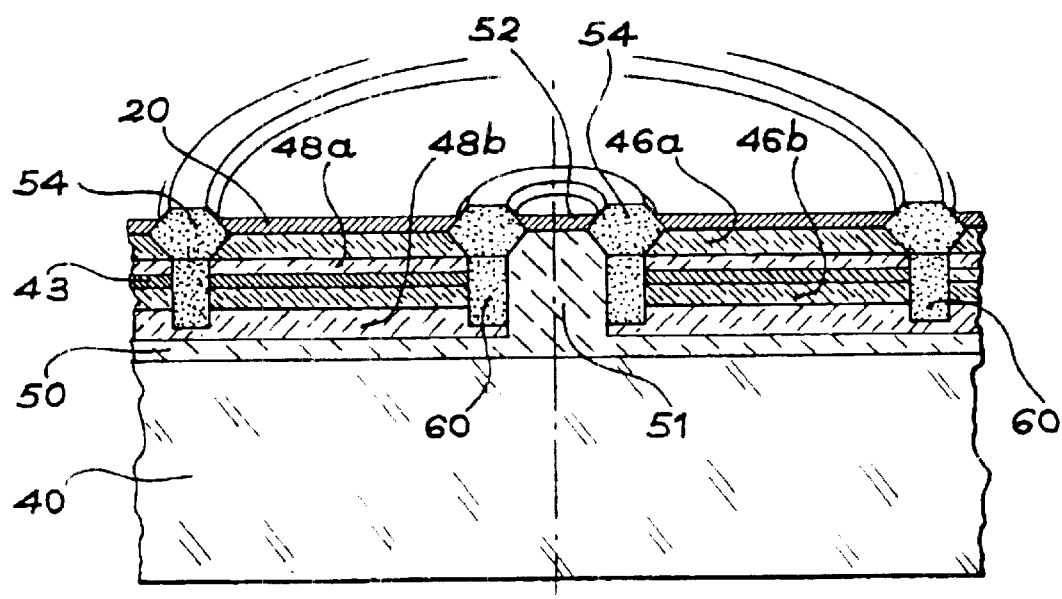
FIG. 6 is an enlarged schematic cross section of part of a chip of the invention comprising photo-voltaic generators and constitutes a fifth embodiment in which the generators comprise two photo-voltaic cells in cascade.

FIG. 6 shows another particular embodiment in which the generator associated with an electrodes 20 comprises two photo-voltaic cells stacked on top of each other.

The first cell comprises first and second regions 46a, 48a that constitute a junction. The second cell, which is located under the first, also comprises a first and second region 46b and 48b that constitute a junction.

Second region 48a of the first cell is connected to first region 46b of the second cell via an ITO transparent conductor layer 43.

Second region 48b of the second cell is electrically connected to counter-electrode 52 via a third doped region 50 that lies over the glass substrate and constitutes a passage 51 through the other semi-conductor regions and ITO layer 43.

In the example described above third region 50 is $P^+$-type silicon, first regions 46a, 46b of the cells are $N^+$-type silicon and second regions 48a, 48b are P-type silicon.

It will be seen that field isolation segments 54 are seen to separate electrode 20 from counter-electrode 52 and are extended by barriers 60 that can extend to third doped region 50 to laterally isolate the junctions of the photo-voltaic cells.

It will also be seen that the structure of electrode 20 is also such that it constitutes a circular area that surrounds counter-electrode 52 disposed in the center. This structure can also be used in the other embodiments described above.

Figure 7:
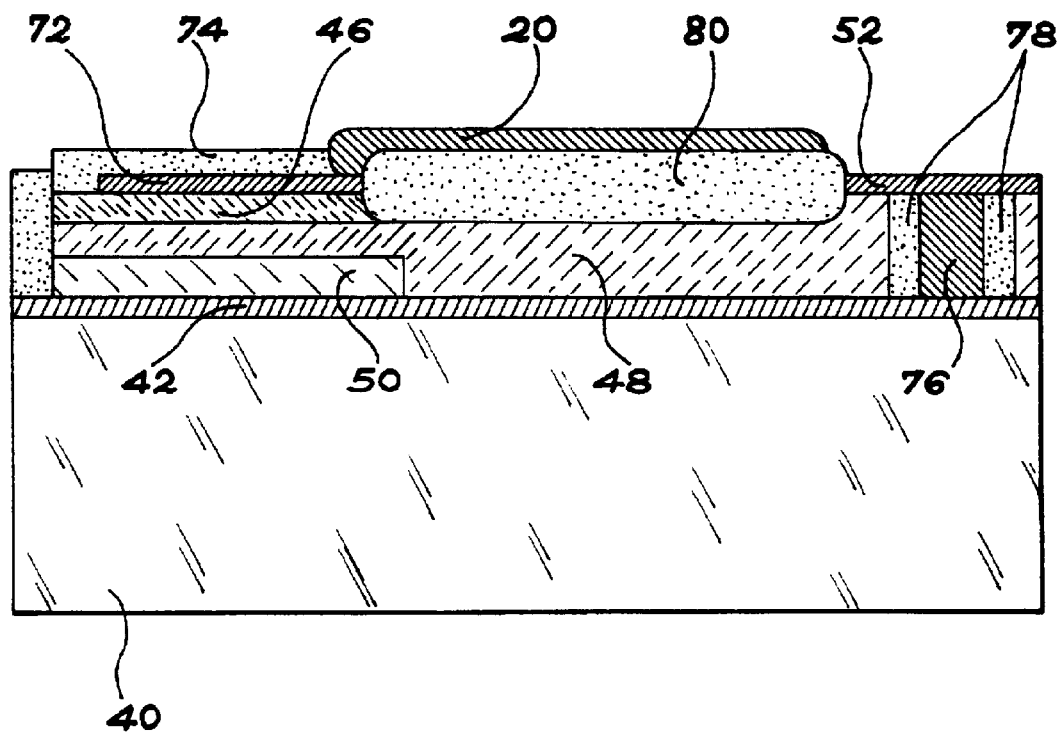
FIG. 7 is an enlarged schematic cross section of part of a chip of the invention comprising photo-voltaic generators and constitutes a sixth embodiment.

FIG. 7 shows a second possible embodiment of an electrode of the chip associated with a single-junction electric generator.

The structure of FIG. 7 differs from those described above mainly in that electrode 20 is offset relative to the photo-voltaic junction.

A first doped region $N^+$ 46 of the junction is electrically connected to the electrode via an electric conductor 72 that is insulated from its surroundings by an oxide layer 74.

A second doped region P 48, which constitutes a junction with the first region, is connected to a counter-electrode 52 via a third doped region 50 $P^+$ with a greater concentration of impurities, via an ITO transparent conductor layer 42 and a metal conductor drain 76.

Metal conductor drain 76, the sides of which are insulated by oxide surfaces 78, is fitted transversally through second doped region 48 that runs under electrode 20 to counter-electrode 52. The drain connects the counter-electrode to the embedded transparent conductor layer 42.

Electrode 20 is electrically insulated and separated from second doped region 48 via a thick oxide segment 80. The segment prevents a short circuit occurring between the doped first and second regions.

In order to produce the structures described above, techniques of doping, etching, oxidising, the creation of barriers or conducting paths are widely resorted to that are well known in the fields of micro-electronics and the production of integrated microstructures. Consequently, the techniques are not described in detail in the present document.

I claim:

1. A chip comprising:

a base having a surface;

a plurality of components integrated in said base, each component having a dedicated electrode that is electrically isolated from the electrode of at least one other component, and a counter-electrode, wherein each component is configured to operate as an electric generator that generates a polarization voltage or current when activated by an energy source external to the chip, and wherein said polarization voltage or current causes a portion of a medium to deposit on the dedicated electrode of a component when the medium is brought into contact with said surface.

2. The chip of claim 1 wherein the dedicated electrodes are separated from each other in a manner that forms microgrooves.

3. The chip of claim 1 wherein the dedicated electrodes are separated from each other in a manner that forms mesa structures.

4. The chip of claim 1 wherein the components are selected from the group consisting of photo-voltaic, thermoelectric and piezo-electric components.

5. The chip of claim 1 wherein the base of the chip comprises a transparent substrate and the energy source comprises at least one beam of light.

6. The chip of claim 1 wherein each component comprises at least one pn junction having a first region of a first conductivity type coupled to said each component's dedicated electrode and a second region of a second conductivity type coupled to said counter-electrode.

7. The chip of claim 6 wherein the second region of each pn junction is coupled to the counter-electrode via a layer of semiconductor material of the second conductivity type having a greater concentration of doping impurities than that of said second region of the junction.

8. The chip of claim 6 wherein the second region of each pn junction is coupled to the counter-electrode via a layer of transparent conductor material.

9. The chip of claim 6 wherein the counter-electrode is disposed on the surface of the base.

10. The chip of claim 9 wherein said counter-electrode is separated from the chip and electrically coupled to each second region of each pn junction via at least one connection terminal.

11. The chip of claim 1 wherein the dedicated electrodes and counter-electrode are provided on the surface of the base and are separated by segments of field oxide and said components are separated by insulation barriers that pass through at least one layer of doped semiconductor.

12. The chip of claim 7 wherein the second region is coupled to the counter-electrode via a layer of transparent conductor material.

13. A system comprising a plurality of chips according to claim 1.

14. A method of depositing a portion of a medium on a chip, said chip comprising a base having a surface and a plurality of components integrated in said base, each component coupled between a dedicated electrode that is electrically isolated from the electrode of at least one other component, and a counter-electrode, each component configured to operate as an electric generator that generates a polarization voltage or current when activated by an energy source external to the chip, the method comprising the steps of:

bringing the dedicated electrodes into contact with a medium; and selectively activating at least one component, by selectively applying an energy source to the at least one component, to cause a selective polarization of the at least one selectively activated component, wherein a polarization voltage or current generated by the at least one selectively activated component causes a portion of the medium to deposit on the dedicated electrode associated with the at least one selectively activated component.

15. The method of claim 14 wherein the energy source comprises a beam of light.

16. The method of claim 15 wherein the beam of light comprises a plurality of individual sources of light arranged to match respectively with said plurality of components of the chip.

17. The method of claim 15 wherein the beam of light comprises light passed through an insolation mask having apertures that selectively match the electric generators to be activated.

18. The method of claim 15 wherein the beam of light derives from a source of scattered light using a liquid-crystal insolation mask.

19. The method of claim 15 wherein the energy source comprises a beam of electrons.

* * * * *